(12) United States Patent
Isaji

(10) Patent No.: US 9,820,417 B2
(45) Date of Patent: Nov. 14, 2017

(54) ELECTRIC APPARATUS

(71) Applicant: Sakai Display Products Corporation, Sakai-shi, Osaka (JP)

(72) Inventor: Kohji Isaji, Sakai (JP)

(73) Assignee: Sakai Display Products Corporation, Sakai-shi, Osaka (JP)

( * ) Notice: Subject to any disclaimer, the term of this patent is extended or adjusted under 35 U.S.C. 154(b) by 0 days.

(21) Appl. No.: 15/031,063

(22) PCT Filed: Oct. 16, 2014

(86) PCT No.: PCT/JP2014/077570
§ 371 (c)(1),
(2) Date: Apr. 21, 2016

(87) PCT Pub. No.: WO2015/060195
PCT Pub. Date: Apr. 30, 2015

(65) Prior Publication Data
US 2016/0255749 A1 Sep. 1, 2016

(30) Foreign Application Priority Data

Oct. 23, 2013 (JP) ................................ 2013-220494

(51) Int. Cl.
*H05K 7/14* (2006.01)
*H05K 7/18* (2006.01)
*H05K 9/00* (2006.01)

(52) U.S. Cl.
CPC ......... *H05K 9/0054* (2013.01); *H05K 9/0015* (2013.01); *H05K 9/0039* (2013.01)

(58) Field of Classification Search
CPC ... H05K 9/0054; H05K 9/0015; H05K 9/0039
USPC ........................................ 361/799, 816, 818
See application file for complete search history.

(56) References Cited

U.S. PATENT DOCUMENTS 5,786,989 A * 7/1998 Kawabe ................. H05K 1/181
174/138 G
8,295,054 B2 * 10/2012 Lu ........................ H05K 7/1417
361/728
8,767,142 B2 * 7/2014 Toyoyama ............ G02F 1/1333
349/149

(Continued)

FOREIGN PATENT DOCUMENTS

JP 2000-330481 A 11/2000
JP 2003-283177 A 10/2003
JP 2013-083913 A 5/2013

*Primary Examiner* — Hung S Bui
(74) *Attorney, Agent, or Firm* — Bret E. Field; Bozicevic, Field & Francis LLP

(57) ABSTRACT

An electric apparatus according to one embodiment of the present invention comprises an electric equipment, a circuit board which is provided with a plurality of ground parts and is configured to make the electric equipment operate, and a support member having a conductive property which covers the circuit board in a non-contact way and supports the electric equipment. The electric apparatus comprises one conductive member which is electrically connected to one ground part among the plurality of ground parts and the support member, and another conductive member which is electrically connected to another ground part among the plurality of ground parts and is insulated electrically from the support member.

7 Claims, 7 Drawing Sheets

(56) References Cited

U.S. PATENT DOCUMENTS

| | | | |
|---|---|---|---|
| 2006/0139519 A1* | 6/2006 | Okamoto | G02F 1/13452 349/112 |
| 2008/0078574 A1* | 4/2008 | Kang | H05K 9/0015 174/358 |
| 2010/0214199 A1* | 8/2010 | Lin | G02B 6/0083 345/82 |
| 2013/0141664 A1 | 6/2013 | Toyoyama | |

* cited by examiner

ELECTRIC APPARATUS

CROSS-REFERENCE TO RELATED APPLICATIONS

This application is the national phase under 35 U. S. C. §371 of PCT International Application No. PCT/JP2014/077570 which has an International filing date of Oct. 16, 2014 and designated the United States of America.

FIELD

The present invention relates to an electric apparatus to which an electro-magnetic interference (EMI) measure is applied.

BACKGROUND

An electric apparatus includes an electric equipment, a circuit board for making the electric equipment operate, and a support member which supports the electric equipment (see Japanese Patent Laid-Open Publication No. 2000-330481, which is hereinafter referred to as Patent Document 1).

The electric apparatus (a 'display apparatus' in text thereof) described in Patent Document 1 includes a display panel, a circuit board on which a driving circuit for the display panel is mounted, and a frame body (front and rear surface frames' in text thereof) which supports the display panel.

The frame body is made of metal, and is electrically connected to a ground part (a 'pattern for a ground potential' in text thereof) provided on the circuit board. Thus, the frame body has a function to shield a radiation noise due to the driving circuit, a radiation noise from an outside which may adversely affect the driving circuit and the like.

In a case of the electric apparatus described in Patent Document 1, an electrical connection between the frame body and the ground part (that is, grounding of the frame body) is performed by making a metal screw for fastening the frame body and the circuit board together contact with both of the frame body and the ground part.

In this regard, conventionally, the ground part and the metal support member may be electrically connected with each other through a metal gasket in contact with both sides. The gasket serves to ground the support member similar to the screw described in Patent Document 1.

SUMMARY

In order to shift a frequency of the radiation noise inside the apparatus from a resonance frequency, it is necessary for the above-described gasket to be disposed at an appropriate position. Accordingly, for each electric apparatus having different frequencies of the radiation noise from each other, there is a need to prepare circuit boards with different arrangement positions of the ground part from each other. In other words, it is not possible to share the circuit board for a plurality of types of electric apparatuses. Thus, the number of parts when manufacturing the plurality of types of electric apparatuses is unnecessarily increased.

In consideration of the above-described circumstances, it is a major object of the present invention to provide an electric apparatus which is capable of sharing parts.

An electric apparatus according to one embodiment of the present invention comprises an electric equipment, a circuit board which is provided with a plurality of ground parts and is configured to make the electric equipment operate, and a support member having a conductive property which covers the circuit board in a non-contact way and supports the electric equipment. The electric apparatus comprises one conductive member which is electrically connected to one ground part among the plurality of ground parts and the support member, and another conductive member which is electrically connected to another ground part among the plurality of ground parts and is insulated electrically from the support member.

In the electric apparatus according to the embodiment of the present invention, it is preferable that the one and the other conductive members are respectively in non-contact with the support member, and the support member is provided with one and another through holes corresponding to the respective one and the other conductive members, and the electric apparatus further comprises a contact member having a conductive property which is inserted into the one through hole and is in contact with the support member and the one conductive member.

In the electric apparatus according to the embodiment of the present invention, it is preferable that the electric apparatus further comprises a closing member which closes the other through hole.

In the electric apparatus according to the embodiment of the present invention, it is preferable that the electric apparatus further comprises one and another spacers having a non-conductive property which are interposed between the circuit board and the support member, and have the one and the other conductive members disposed inside the one and the other spacers, and the contact member penetrates the one spacer and is in contact with the one conductive member.

In the electric apparatus according to the embodiment of the present invention, it is preferable that the one and the other conductive members respectively have elasticity, and the support member is provided with one and another through holes corresponding to the respective one and the other conductive members, and the electric apparatus further comprises a separating member having the non-conductive property which is inserted into the other through hole and is in contact with the other conductive member to compress and deform the other conductive member in a direction of being separated from the support member.

In the electric apparatus according to the embodiment of the present invention, it is preferable that the one conductive member is in contact with the support member.

In the electric apparatus according to the embodiment of the present invention, it is preferable that the electric apparatus further comprises a separating member having the conductive property which is inserted into the one through hole and is in contact with the support member and the one conductive member to compress and deform the one conductive member in the direction of being separated from the support member.

In the electric apparatus according to the embodiment of the present invention, it is preferable that the electric equipment is a display panel, and the circuit board is configured to display an image on the display panel, and the support member is formed in a frame shape which encloses a peripheral edge part of the display panel.

According to the embodiment of the present invention, the electric apparatus includes the plurality of conductive members and the circuit board. The circuit board is provided with a plurality of ground parts. Hereinafter, each of two conductive members and two ground parts will be exemplified. One (or the other) conductive member is electrically connected to the one (or the other) ground part.

A manufacturer of the electric apparatus selects any one of the two conductive members as one conductive member, for each electric apparatus to be manufactured. Herein, the selected conductive member is disposed at an appropriate position for reducing (for example, shifting a frequency of radiation noise from a resonance frequency) the radiation noise inside the apparatus.

In addition, the one conductive member is electrically connected to the support member. That is, the ground part and the support member are electrically connected through the one conductive member. Therefore, the support member does not only have a function of supporting the electric equipment, but also a function of shielding the radiation noise due to the circuit board, the radiation noise from an outside and the like. Further, the conductive member may reduce the radiation noise inside the apparatus. Thus, an efficient electro-magnetic interference (EMI) measure is applied to the electric apparatus.

According to the preferable embodiment of the present invention, the one conductive member and the support member are electrically connected through the contact member. For this purpose, the contact member is inserted into one through hole (one hole of two through holes) provided in the support member, to be in contact with the one conductive member (one member of the two conductive members) and the support member.

If the support member is provided with only one through hole, there is a need to prepare a support member which is provided with one through hole at a different position for each electric apparatus to be manufactured. In other words, in a case of the electric apparatus according to the embodiment of the present invention, it is possible to share the support member for a plurality of types of electric apparatus.

According to the preferable embodiment of the present invention, the one through hole is closed by the contact member, and the other through hole is closed by the closing member. Therefore, an occurrence of a problem (for example, intrusion of a foreign matter into the apparatus through the through hole) due to the through hole provided in the support member is suppressed.

According to the preferable embodiment of the present invention, by the contact member penetrating the one spacer, it is possible to obtain an electrical connection between the one conductive member and the support member. In addition, by the other spacer, the other conductive member and the support member may be reliably electrically insulated from each other. Further, an occurrence of a short circuit due to a contact between electrical circuits, wirings, and the like on the circuit board and the support member may be suppressed by the spacers.

According to the preferable embodiment of the present invention, the other conductive member and the support member are electrically insulated by the non-conductive separating member. For this purpose, the non-conductive separating member is inserted into the other through hole (the other hole of two through holes) provided in the support member to be in contact with the other conductive member (the other member of two conductive members). In this case, the other conductive member is compressed and deformed in the direction of being separated from the support member.

If the support member is provided with only one through hole, there is a need to prepare a support member which is provided with one through hole at a different position for each electric apparatus to be manufactured. In other words, in a case of the electric apparatus according to the embodiment of the present invention, it is possible to share the support member for a plurality of types of electric apparatus.

According to the preferable embodiment of the present invention, there is no need to separately use a member for making the one conductive member contact with the support member. Accordingly, it is possible to reduce the number of parts.

According to the preferable embodiment of the present invention, the one conductive member and the support member are electrically connected through the conductive separating member. For this purpose, the conductive separating member is inserted into the one through hole (one hole of two through holes) provided in the support member to be in contact with the one conductive member (one member of two conductive members) and the support member. In this case, the one conductive member is compressed and deformed in the direction of being separated from the support member.

The one conductive member being compressed comes into close contact with the conductive separating member by an elastic restoring force thereof. As a result, it is possible to reliably and electrically connect the one conductive member and the support member through the conductive separating member.

According to the preferable embodiment of the present invention, it is possible to form the electric apparatus as the display apparatus.

According to the electric apparatus of one embodiment of the present invention, it is possible to select any one of the two conductive members disposed at different positions from each other in the circuit board as one conductive member, for each electric apparatus to be manufactured. Briefly, there is no need to use a circuit board on which one conductive member is disposed at a different position for each electric apparatus to be manufactured. In other words, it is possible to share the circuit board for a plurality of types of electric apparatuses.

Further, it is possible to reduce and shield the radiation noise by the one conductive member and the support member.

The above and further objects and features will more fully be apparent from the following detailed description with accompanying drawings.

DETAILED DESCRIPTION

Figure 1:
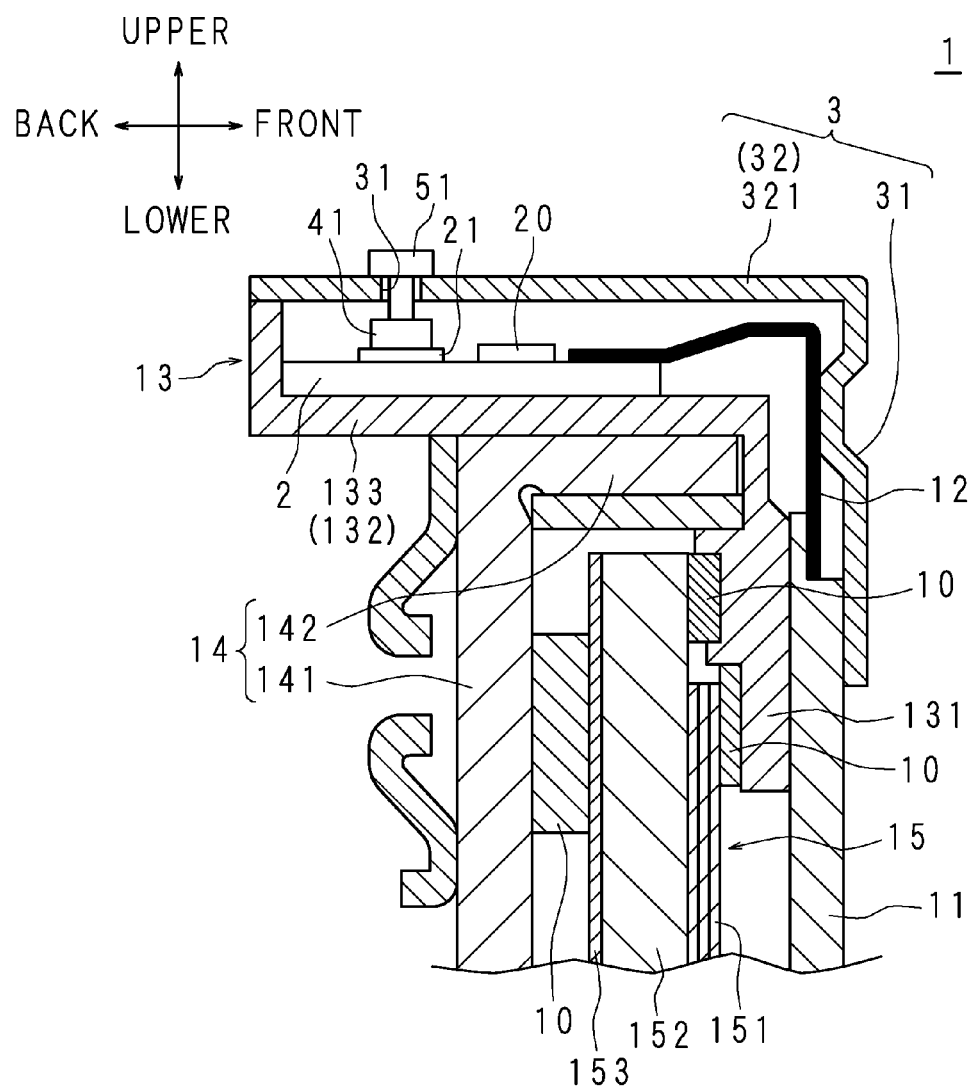
FIG. 1 is a longitudinal-sectional view schematically illustrating a configuration in the vicinity of a first conductive member included in a display apparatus as an electric apparatus according to Embodiment 1 of the present invention.

Hereinafter, embodiments of the present invention will be described in detail with reference to the accompanying drawings illustrating the embodiments thereof. In the following description, upper and lower, back and front, and right and left illustrated by arrows in the drawings are used.

Embodiment 1

Figure 2:
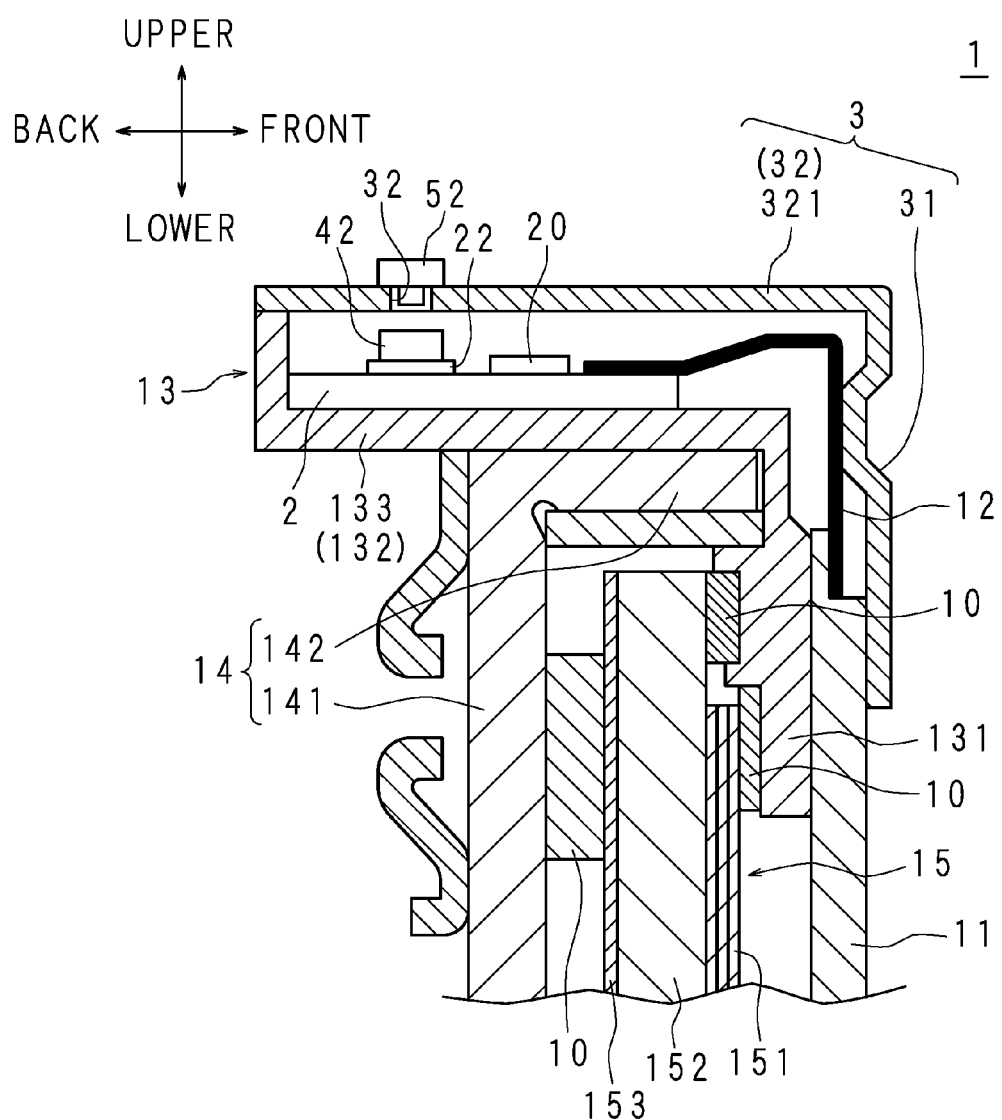
FIG. 2 is a longitudinal-sectional view schematically illustrating a configuration in the vicinity of a second conductive member included in the display apparatus.

FIGS. 1 and 2 are longitudinal-sectional views schematically illustrating a configuration of a display apparatus 1 as an electric apparatus according to Embodiment 1 of the present invention. FIGS. 1 and 2 illustrate a configuration in the vicinity of an upper side part of a display panel 11 to be described below. Further, FIG. 1 illustrates a configuration in the vicinity of a first conductive member 41 included in the display apparatus 1, and FIG. 2 illustrates a configuration in the vicinity of a second conductive member 42 included in the display apparatus 1.

Figure 3A:
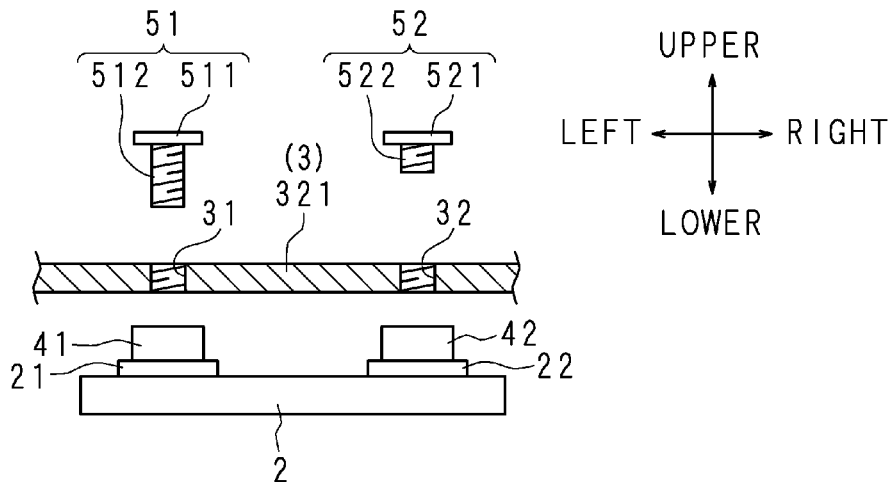
FIG. 3A is a schematic front view describing a procedure of assembling the display apparatus.
Figure 3B:
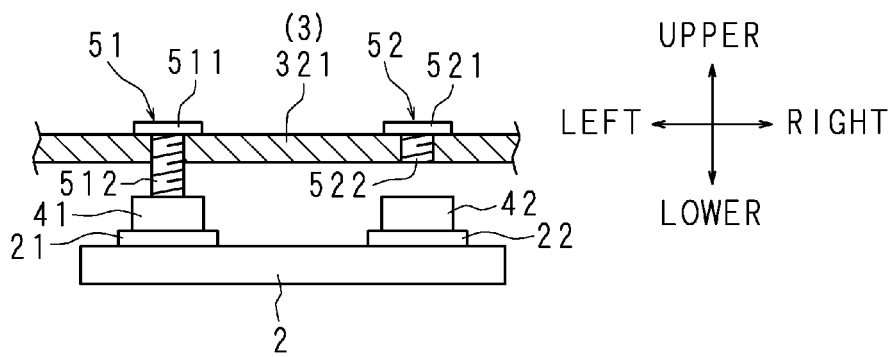
FIG. 3B is a schematic front view describing the procedure of assembling the display apparatus.
Figure 3C:
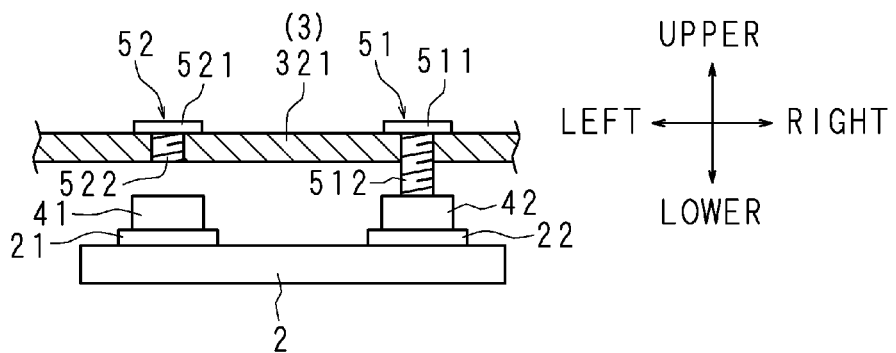
FIG. 3C is a schematic front view describing the procedure of assembling the display apparatus.

FIGS. 3A to 3C are schematic front views describing a procedure of assembling the display apparatus 1. FIGS. 3A to 3C illustrate a configuration in the vicinity of a circuit board 2 and an upper frame part 321, which will be described below.

The display apparatus 1 of the present embodiment is formed as, for example, a television receiving apparatus, a digital signage, a monitor for personal computer or the like.

First, the configuration of the display apparatus 1 will be described.

The display apparatus 1 includes the display panel (an electric equipment) 11, a flexible substrate 12, a panel chassis (hereinafter, referred to as a P chassis) 13, a backlight chassis (hereinafter, referred to as a BL chassis) 14, a backlight unit 15, a circuit board 2, a bezel (support member) 3, a cabinet (not illustrated) which houses these components while a display region to be described below is exposed to an outside and the like.

The display panel 11 is formed by using a rectangular liquid crystal display panel. The display panel 11 is disposed in a vertical position. The display panel 11 has the rectangular display region, and a rectangular frame-shaped frame region having light-shielding properties, which encloses the display region. The display panel 11 is formed by using a glass substrate on a front side and a glass substrate on a back side. Liquid crystal is sealed between the two glass substrates. Light transmittance of the display region of the display panel 11 is changed depending on a voltage applied to the liquid crystal of the display panel 11.

Hereinafter, the configuration in the vicinity of the upper side part of the display panel 11 will be mainly described.

The display panel 11 is electrically connected to the circuit board 2 through the flexible substrate 12.

The circuit board 2 is formed by using a rigid substrate in a lateral position. The circuit board 2 has a driving circuit 20 mounted on an upper surface thereof. The driving circuit 20 drives the liquid crystal of the display panel 11 by controlling a voltage to be applied to the liquid crystal of the display panel 11. As a result, light transmittance of the display region of the display panel 11 is controlled.

The circuit board 2 has N ground parts (wiring patterns for ground potential) juxtaposed in a horizontal direction on the upper surface thereof. Herein, N is a natural number of 2 or more (N 2). For simplicity of description, in the present embodiment, a case in which N is 2 will be exemplified. Hereinafter, in order to identify two ground parts, a left ground part is referred to as a first ground part 21 (see FIGS. 1 and 3A to 3C), and a right ground part is referred to as a second ground part 22 (see FIGS. 2 and 3A to 3C).

The first ground part 21 is electrically connected with a first conductive member 41. The second ground part 22 is electrically connected with a second conductive member 42. The first and second conductive members 41 and 42 in the present embodiment are metal members which protrude upwardly from the upper surface of the first and second ground parts 21 and 22.

The bezel 3 has a conductive property. The bezel 3 in the present embodiment is made of metal. The bezel 3 is a rectangular frame body for supporting the display panel 11 from a front side. The bezel 3 has a plate-shaped front frame part 31, and a plate-shaped side frame part 32 which protrudes backwardly from an outer peripheral edge part of the front frame part 31. The front frame part 31 is disposed to face a frame region of the display panel 11 from the front side. The side frame part 32 encloses four side parts (peripheral edge parts) of the display panel 11. Hereinafter, a portion corresponding to the upper side part of the display panel 11 in the side frame part 32 is referred to as an upper frame part 321.

The upper frame part 321 has N through holes juxtaposed in a horizontal direction therein. A left through hole is referred to as a first through hole 31 (see FIGS. 1 and 3A to 3C), and a right through hole is referred to as a second through hole 32 (see FIGS. 2 and 3A to 3C). Arrangement positions of the first and second through holes 31 and 32 in a back and forth direction and a right and left direction correspond to the arrangement positions of the first and second ground parts 21 and 22 (further the first and second conductive members 41 and 42) in the back and forth direction and the right and left direction. In other words, the first and second conductive members 41 and 42 are located directly below the first and second through holes 31 and 32.

The first and second through holes 31 and 32 have a female screw part formed on an inner surface thereof, respectively. Therefore, if conductive screws are screwed to the first or second through hole 31 or 32, the screws and the upper frame part 321 (that is, the bezel 3) are contact with each other, thus to be electrically connected to each other.

Further, the bezel 3 is not limited to the configuration in which the female screw parts are formed on the inner surfaces of the respective first and second through holes 31 and 32, and may have a configuration in which conductive female screw members (not illustrated) are fitted to the respective first and second through holes 31 and 32. In this case, if the conductive screws are screwed to the female screw members, the screws and the upper frame part 321 (that is, the bezel 3) are electrically connected through the female screw members.

A conductive screw (contact member) 51 is made of, for example, metal, and has a head part 511 and a male screw part 512, which are integrally formed therewith.

A closing screw (closing member) 52 is made of, for example, a synthetic resin, and has a head part 521 and a male screw part 522, which are integrally formed therewith.

Both the conductive screw 51 and the closing screw 52 are detachable to the respective first and second through holes 31 and 32. In addition, it is preferable that the conductive screw 51 and the closing screw 52 are non-translucent (have light-shielding properties or light reflecting properties).

The P chassis 13 is a rectangular frame body for supporting the display panel 11 from the back side. The P chassis 13 has a plate-shaped front frame part 131, and a plate-shaped side frame part 132 which protrudes backwardly from an outer peripheral edge part of the front frame part 131. The P chassis 13 is disposed on the back side from the front frame part 31 of the bezel 3, and inside from the side frame part 32. In addition, the front frame parts 31 and 131 are disposed to face each other, and the side frame parts 32 and 132 are disposed to face each other. Hereinafter, a portion in the side frame part 132, which is disposed to face the upper frame part 321 of the bezel 3, is referred to as an upper frame part 133.

The display panel 11 is sandwiched between the front frame part 31 of the bezel 3 and the front frame part 131 of the P chassis 13.

The side frame part 32 of the bezel 3 and the side frame part 132 of the P chassis 13 are disposed apart from each other. The circuit board 2 is disposed on the upper surface of the upper frame part 133. In this case, the circuit board 2 and the upper frame part 321 of the bezel 3 are disposed to face each other. All of the respective parts (the driving circuit 20, the first and second conductive members 41 and 42, and the like) on the circuit board 2 are disposed apart from the bezel 3. Briefly, the circuit board 2 is covered by the bezel 3 in a non-contact way.

The flexible substrate 12 is disposed in a void between the bezel 3 and the P chassis 13.

In FIGS. 1 and 3B, the conductive screw 51 is inserted into the first through hole 31 of the bezel 3. More specifically, the head part 511 of the conductive screw 51 is located on the upper side of the upper frame part 321, and the male screw part 512 is screwed to the first through hole 31 then protrudes to a lower side of the upper frame part 321. A tip portion of the male screw part 512 is in contact with a tip portion of the first conductive member 41. As a result, the first conductive member 41 (further the first ground part 21) and the bezel 3 are electrically connected through the conductive screw 51.

In FIGS. 2 and 3B, the closing screw 52 closes the second through hole 32 of the bezel 3. More specifically, the head part 521 of the closing screw 52 is located on the upper side of the upper frame part 321, and the male screw part 522 is screwed to the second through hole 32. In the present embodiment, a tip portion of the male screw part 522 is apart from a tip portion of the second conductive member 42. Therefore, the second conductive member 42 is electrically insulated from the parts (for example, the bezel 3) other than the second ground part 22 through air. In this case, the closing screw 52 may be conductive or non-conductive.

When the closing screw 52 is non-conductive, the tip portion of the male screw part 522 may be in contact with the tip portion of the second conductive member 42. Also in this case, the second conductive member 42 is insulated electrically from the parts other than the second ground part 22 through air.

Further, the closing member in the embodiment of the present invention may be configured to be undetachably attached to any one of the first and second through holes 31 and 32.

The BL chassis 14 is formed in a dish shape. The BL chassis 14 has a plate-shaped back surface part 141 corresponding to a bottom of the dish, and a peripheral surface part 142 corresponding to a peripheral surface of the dish. The BL chassis 14 is disposed on the back side from the front frame part 131 of the P chassis 13, and inside from the side frame part 132.

The backlight unit 15 has an optical sheet group 151, a light guide plate 152, a reflection sheet 153, and a light source unit (not illustrated).

The optical sheet group 151 is formed by laminating a plurality of optical sheets each of which is formed in a rectangular shape. The optical sheet group 151 is disposed to face the display panel 11, so as to cover the back side of the display region of the display panel 11. Each optical sheet included in the optical sheet group 151 has a light diffusion function, a light collection function and the like.

The light guide plate 152 is formed in a rectangular plate shape. The light guide plate 152 is made of, for example, an acrylic resin. The optical sheet group 151 is disposed in close contact with a front surface of the light guide plate 152.

The light guide plate 152 emits light made incident inside of the light guide plate 152 from the front surface of the light guide plate 152.

The light made incident inside of the light guide plate 152 is transmitted through the front surface of the light guide plate 152 to emit to an outside of the light guide plate 152. However, a part of the light made incident inside of the light guide plate 152 may transmit through the back surface (that is, light leakage occurs). The reflection sheet 153 is formed in a rectangular shape.

The reflection sheet 153 is disposed in close contact to the back surface of the light guide plate 152, and completely covers the back surface of the light guide plate 152. Accordingly, the light leaked from the back surface of the light guide plate 152 is reflected by the reflection sheet 153, and again made incident inside of the light guide plate 152.

The light source unit is disposed to face an end face (for example, a lower end face) of the light guide plate 152.

The backlight unit 15 as described above is housed inside of the BL chassis 14, and is sandwiched between the front frame part 131 of the P chassis 13 and the back surface part 141 of the BL chassis 14 through elastic members 10, 10 and . . . .

Next, illumination of the display panel 11 by the backlight unit 15 will be described.

Light emitted by the light source unit is transmitted through the end face of the light guide plate 152 to be made incident inside of the light guide plate 152 directly or by being reflected by the reflection sheet 153.

The light made incident inside of the light guide plate 152 is emitted from the front surface of the light guide plate 152. The light emitted from the light guide plate 152 is transmitted through the back surface of the display panel 11, and is made incident inside of the display panel 11 through diffusion, light collection, or the like by the optical sheet group 151.

As described above, the display panel 11 is illuminated by the backlight unit 15 from the back side. The liquid crystal is driven by the driving circuit 20, such that a part of the light made incident inside of the display panel 11 is transmitted through the display panel 11, and a residual part thereof is blocked from passing through the display panel 11. As a result, an image is displayed on the display region of the display panel 11.

Next, a manufacturing procedure of the display apparatus 1 will be described.

By a manufacturer of the display apparatus 1, a display apparatus 1 in a state that the conductive screw 51 and the closing screw 52, and the cabinet are not yet attached (see FIG. 3A, hereinafter referred to as a screw-unequipped display unit) is prepared. The screw-unequipped display unit may be manufactured by substantially the same procedure as the manufacturing procedure of a conventional display apparatus. However, instead of the conventional circuit board and bezel, the circuit board 2 on which the first and second conductive members 41 and 42 are mounted, and the bezel 3 provided with the first and second through holes 31 and 32 are used.

Then, by the manufacturer, the conductive screw 51 is attached to the first through hole 31 (see FIG. 3B). As a result, the bezel 3 and the first ground part 21 are electrically connected through the conductive screw 51 and the first conductive member 41. In this case, there is no need to attach any member including the closing screw 52 to the second through hole 32. Thus, the bezel 3 and the second ground part 22 and second conductive member 42 are not electrically connected. Hereinafter, this state is referred to as a display unit in the first state.

Next, by operating the driving circuit 20, for example, the manufacturer performs a noise assessment of the display unit in the first state.

Thereafter, by the manufacturer, the conductive screw 51 attached to the first through hole 31 is removed, and is attached to the second through hole 32 (see FIG. 3C). As a result, the bezel 3 and the second ground part 22 are electrically connected through the conductive screw 51 and the second conductive member 42. In this case, there is no need to attach any member including the closing screw 52 to the first through hole 31. Thus, the bezel 3 and the first ground part 21 and first conductive member 41 are not electrically connected. Hereinafter, this state is referred to as a display unit in the second state.

Next, similar to the noise assessment of the display unit in the first state, the manufacturer performs the noise assessment of the display unit in the second state.

In both the display units in the first and second states, a radiation noise due to the driving circuit 20 is shielded by the bezel 3.

When the radiation noise of the display unit in the first state (or in the second state) is more reduced than that of the display unit in the second state (or in the first state), it can be seen that the conductive member to be electrically connected to the bezel 3 is the first conductive member 41 (or the second conductive member 42). It is conceivable that such a difference may be caused by the first conductive member 41 (or the second conductive member 42) in which a frequency of the radiation noise is shifted from the resonance frequency.

Therefore, the manufacture selects the first conductive member 41 (or the second conductive member 42) of the first and second conductive members 41 and 42. Then, by the manufacturer, the conductive screw 51 attached to the second through hole 32 is removed, and is again attached to the first through hole 31 (or the conductive screw 51 attached to the second through hole 32 is left as it is).

Then, by the manufacturer, the closing screw 52 is attached to the second through hole 32 (or the first through hole 31) (see FIG. 3B (or FIG. 3C)).

Since the conductive screw 51 and the closing screw 52 close the first and second through holes 31 and 32, intrusion of a foreign matter between the bezel 3 and the P chassis 13 through the first and second conductive members 41 and 42 is suppressed. When both the conductive screw 51 and the closing screw 52 are non-translucent, light leakage through the first and second conductive members 41 and 42 is suppressed. Further, when the closing screw 52 has a conductive property, incoming and outgoing of the radiation noise through the second through hole 32 (or the first through hole 31) is suppressed.

In FIGS. 1, 2 and 3B, the first conductive member 41 and the first through hole 31 function as one conductive member and one through hole in the embodiment of the present invention. In addition, the second conductive member 42 and the second through hole 32 function as the other conductive member and the other through hole in the embodiment of the present invention.

In FIG. 3C, the second conductive member 42 and the second through hole 32 function as one conductive member and one through hole in the embodiment of the present invention. In addition, the first conductive member 41 and the first through hole 31 function as the other conductive member and the other through hole in the embodiment of the present invention.

Further, the manufacturer may not perform the noise assessment for the display units in the first and second states. In this case, the manufacturer may estimate that any of the first and second conductive members 41 and 42 is optimum for reduction of radiation noise, select any one of the first and second conductive members 41 and 42 based on the estimated result, and attach the conductive screw 51 and the closing screw 52 to the first and second through holes 31 and 32, so that the conductive screw 51 comes in contact with the selected member.

After the conductive screw 51 and the closing screw 52 are attached to the screw-unequipped display unit, by the manufacturer, the display unit in the first or second state is attached to the cabinet, thereby the display apparatus 1 is assembled.

When mass producing the display apparatuses 1, 1 and . . . as described above, it is possible to optimize the reduction of radiation noise for each display apparatus 1, 1 or . . . . In this case, the display apparatuses 1, 1 and . . . may be manufactured by using the common circuit boards 2, 2 and . . . , and the bezels 3, 3 and . . . . Therefore, it is possible to reduce the number of parts.

Further, when the display apparatus 1 does not include the bezel 3, for example, the support member according to the embodiment of the present invention may be a front cabinet having a conductive property.

If the circuit board 2 is not provided with the second ground part 22 (or first ground part 21), and the bezel 3 is not provided with the second through hole 32 (or the first through hole 31), the configuration of the circuit board 2 and the bezel 3 may be more facilitated than that of the present embodiment. However, in this case, in the first conductive member 41 (or the second conductive member 42), it may not be possible to efficiently reduce the radiation noise.

In order to solve such the problem, it is conceivable that the circuit board 2 provided with the first ground part 21 and bezel 3 provided with the first through hole 31, and the circuit board 2 provided with the second ground part 22 and bezel 3 provided with the second through hole 32 are prepared, and either of them, which is more suitable for the reduction of radiation noise, is selected. However, in this case, replacing one circuit board 2 and bezel 3 with the other circuit board 2 and bezel 3 is complicated, such that it is not possible to efficiently perform the noise assessment. Furthermore, the number of parts is increased.

Embodiment 2

Figure 4A:
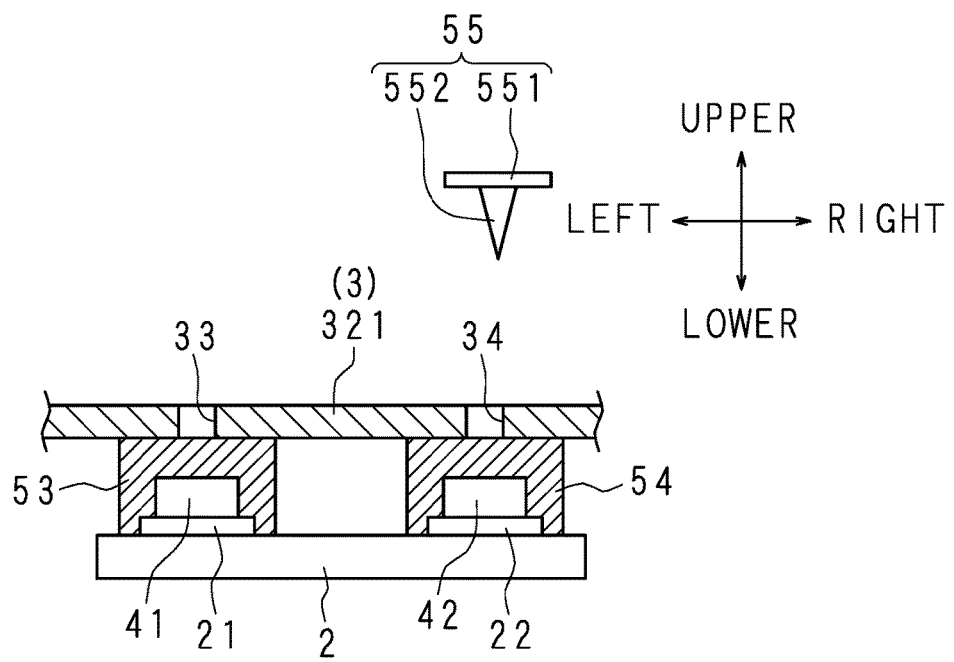
FIG. 4A is a schematic front view describing a procedure of assembling a display apparatus as an electric apparatus according to Embodiment 2 of the present invention.
Figure 4B:
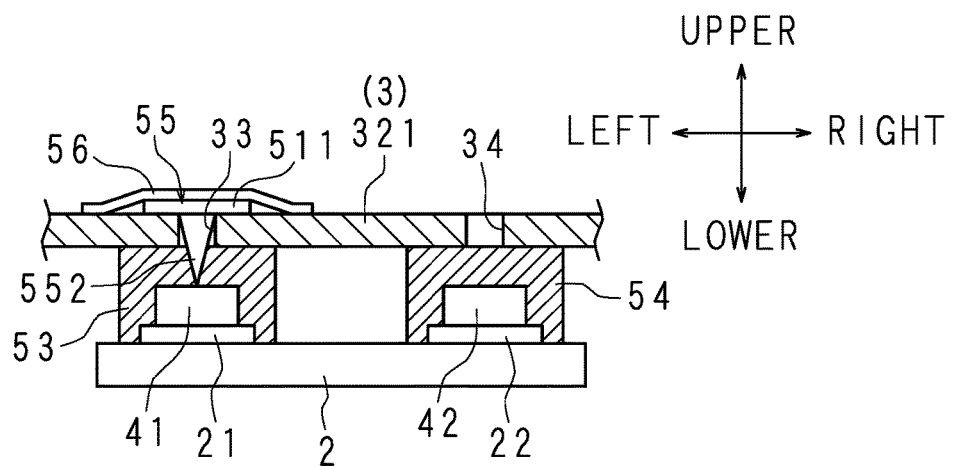
FIG. 4B is a schematic front view describing the procedure of assembling the display apparatus.

FIGS. 4A and 4B are schematic front views describing a procedure of assembling the display apparatus 1 as an electric apparatus according to Embodiment 2 of the present invention. FIGS. 4A and 4B correspond to FIGS. 3A and 3B.

The display apparatus 1 of the present embodiment has substantially the same configuration as the display apparatus 1 of Embodiment 1. Hereinafter, a difference from Embodiment 1 will be described, and the other portions corresponding to Embodiment 1 will be denoted by the same reference numerals, and will not be described.

In the present embodiment, first and second spacers 53 and 54 are disposed between the circuit board 2 and the upper frame part 321 of the bezel 3. In addition, the present embodiment has first and second through holes 33 and 34 instead of the first and second through holes 31 and 32 of Embodiment 1, and a conductive pin 55 instead of the conductive screw 51 and closing screw 52 of Embodiment 1.

There is no need for the first and second through holes 33 and 34 to form the female screw part on an inner surface thereof, unlike the first and second through holes 31 and 32 of Embodiment 1.

The conductive pin 55 is made of, for example, metal, and has a head part 551 and a needle-shaped sharp part 552, which are integrally formed therewith.

The first spacer 53 has the non-conductive property and is non-translucent, and the first conductive member 41 is disposed inside thereof. The first spacer 53 reliably electrically insulates the first conductive member 41 from parts other than the first ground part 21. In other words, the first spacer 53 does not block an electrical connection between the first conductive member 41 and the first ground part 21.

An upper portion of the first spacer 53 is in contact with the upper frame part 321 of the bezel 3 (more specifically, the opening peripheral edge part of the first through hole 33). Briefly, the first spacer 53 also functions as a closing member which closes the first through hole 33 from the lower side of the upper frame part 321. In this case, the first spacer 53 suppresses the intrusion of a foreign matter and light leakage. A lower portion of the first spacer 53 is in contact with the circuit board 2.

The first spacer 53 has an amount of mechanical strength that can be penetrated against an external force so as to approach the circuit board 2 and the bezel 3, and by the sharp part 552 of the conductive pin 55.

The first spacer 53 of the present embodiment is formed in a cylindrical shape having a bottom, which is made of synthetic rubber, a cushioning material or the like. After the first conductive member 41 is attached to the first ground part 21 of the circuit board 2, the first spacer 53 covers the first conductive member 41. Then, if the circuit board 2 is attached to the P chassis 13, and further, the P chassis 13 is attached to the bezel 3, the first spacer 53 is interposed between the circuit board 2 and the upper frame part 321 of the bezel 3 with being in contact therewith.

The second spacer 54 has the same configuration as the first spacer 53, except that the second conductive member 42 is disposed inside thereof.

In FIG. 4B, the conductive pin 55 is inserted into the first through hole 33 of the bezel 3. More specifically, the head part 551 of the conductive pin 55 is located on the upper side of the upper frame part 321, and is fixed to the upper frame part 321 by using an adhesive tape 56. Meanwhile, the sharp part 552 of the conductive pin 55 is loosely inserted into the first through hole 33, and further, protrudes to the lower side of the upper frame part 321, while penetrating the first spacer 53. A tip portion of the sharp part 552 is in contact with the tip portion of the first conductive member 41. As a result, the first conductive member 41 (further the first ground part 21) and the bezel 3 are electrically connected through the conductive pin 55.

The adhesive tape 56 suppresses the conductive pin 55 from dropping out unnecessarily from the first or second through hole 33 or 34. However, the adhesive tape 56 is easily removed or destroyed by applying an external force thereto by the manufacturer, for example. Therefore, the conductive pin 55 is detachable to the respective first and second through holes 33 and 34, and the first and second spacers 53 and 54.

The adhesive tape 56 may be conductive or non-conductive.

When assessing the noise of the respective display units in the first and second states, the conductive pin 55 is used similar to the conductive screw 51 of Embodiment 1. Briefly, first, the noise assessment of the display unit in the first state is performed in a state in which the bezel 3 and the first ground part 21 are electrically connected through the conductive pin 55 and the first conductive member 41. Next, attaching and detaching works of the conductive pin 55 are performed. Then, the noise assessment of the display unit in the second state is performed in a state in which the bezel 3 and the second ground part 22 are electrically connected through the conductive pin 55 and the second conductive member 42.

Thereafter, the manufacturer selects the first conductive member 41 (or the second conductive member 42) of the first and second conductive members 41 and 42, which may efficiently reduce the radiation noise. Further, by the manufacturer, the conductive pin 55 attached to the second through hole 34 is removed, and is again attached to the first through hole 33 (or the conductive pin 55 attached to the second through hole 34 is left as it is).

In Embodiment 1, the process of attaching the closing screw 52 is required. However, in the present embodiment, there is no need to separately attach the closing member.

Further, the display apparatus 1 may be configured to separately attach a closing member having a conductive property. For example, by the manufacturer, the adhesive tapes 56 and 56 having a conductive property may be prepared, the closing screw 52 may be fixed with one tape, and the second through hole 34 (or the first through hole 33) may be closed with the other tape.

In this regard, when performing the noise assessment, there is no need to fix the conductive pin 55 with the adhesive tape 56. In this case, the conductive pin 55 may be tentatively fixed by using a detachable tape which has lower adhesiveness than the adhesive tape 56 and is capable of being detached.

In FIG. 4B, the first conductive member 41, the first through hole 33, and the first spacer 53 function as one conductive member, one through hole, and one spacer in the embodiment of the present invention. In addition, the second conductive member 42, the second through hole 34, and the second spacer 54 function as the other conductive member, the other through hole, and the other spacer in the embodiment of the present invention.

Even when mass producing the display apparatuses 1, 1 and . . . as described above, it is possible to optimize the reduction of radiation noise for each display apparatus 1, 1 or .... In this case, the display apparatuses 1, 1 and ... may be manufactured by using the common circuit boards 2, 2 and ..., and the bezels 3, 3 and .... Therefore, it is possible to reduce the number of parts.

In addition, the first and second spacers 53 and 54 suppress an unnecessarily electrical connection between the respective parts (the driving circuit 20, the first and second conductive members 41 and 42, and the like) on the circuit board 2 and the bezel 3.

Further, the conductive pin 55 may have a configuration in which the tip portion of the sharp part 552 is entered inside of the first or second conductive member 41 or 42, thereby reliably coming in contact with the first or second conductive member 41 or 42.

Furthermore, instead of the conductive pin 55, a conductive screw which is provided with a sharp part on the tip portion of the male screw part may be used. In this case, the bezel 3 may have first and second through holes 31 and 32 instead of the first and second through holes 33 and 34.

Embodiment 3

Figure 5A:
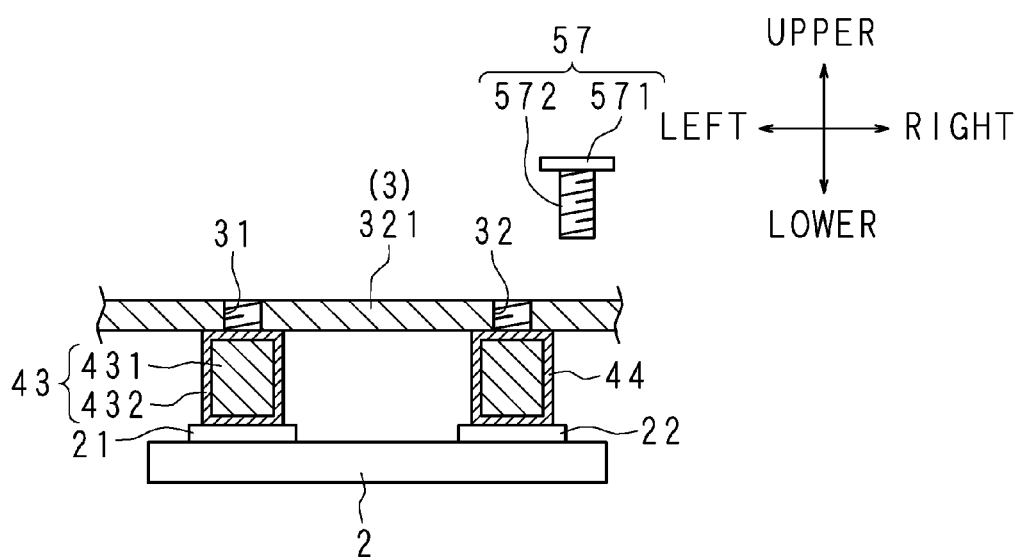
FIG. 5A is a schematic front view describing a procedure of assembling a display apparatus as an electric apparatus according to Embodiment 3 of the present invention.
Figure 5B:
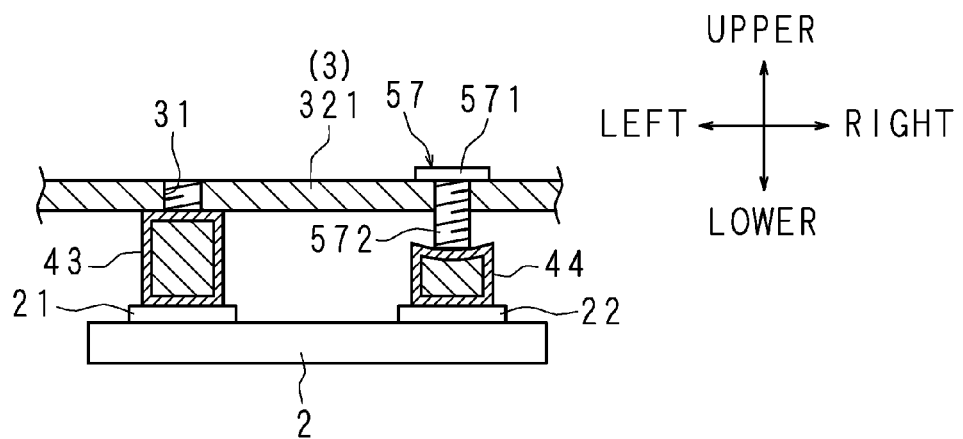
FIG. 5B is a schematic front view describing the procedure of assembling the display apparatus.

FIGS. 5A and 5B are schematic front views describing a procedure of assembling the display apparatus 1 as an electric apparatus according to Embodiment 3 of the present invention. FIGS. 5A and 5B correspond to FIGS. 3A and 3B.

The display apparatus 1 of the present embodiment has substantially the same configuration as the display apparatus 1 of Embodiment 1 Hereinafter, a difference from Embodiment 1 will be described, and the other portions corresponding to Embodiment 1 will be denoted by the same reference numerals, and will not be described.

In the present embodiment, instead of the first and second conductive members 41 and 42 of Embodiment 1, first and second conductive members 43 and 44 are provided.

Further, in the present embodiment, instead of the conductive screw 51 and the closing screw 52 of Embodiment 1, a non-conductive screw (separating member having the non-conductive property) 57 is provided.

The first conductive member 43 has elasticity. Thus, this member is compressed downwardly to be elastically deformed when an external force is applied downwardly thereto, and is restored to an original shape when the external force is removed. In addition, the first conductive member 43 is non-translucent.

The above-described first conductive member 43 has an elastic member 431 having the non-conductive property, and a conductive layer 432 which covers a surface of the elastic member. The elastic member 431 is made of, for example, synthetic rubber, a cushioning material or the like. The conductive layer 432 is a metal layer laminated on the surface of the elastic member 431, for example.

The first conductive member 43 is attached to the first ground part 21.

The second conductive member 44 has the same configuration as the first conductive member 43, except for being attached to the second ground part 22.

Upper portions of the first and second conductive members 43 and 44 are in contact with the upper frame part 321 of the bezel 3 (more specifically, the opening peripheral edge part of the first and second through holes 31 and 32). Briefly, the first and second conductive members 43 and 44 also function as a closing member which closes the first and second through holes 31 and 32 from the lower side of the upper frame part 321. In this case, the first and second conductive members 43 and 44 suppress the intrusion of a foreign matter and light leakage.

The non-conductive screw 57 is made of, for example, a synthetic resin, and has a head part 571 and a male screw part 572, which are integrally formed therewith. The non-conductive screw 57 is non-translucent.

In FIG. 5B, the non-conductive screw 57 is inserted into the second through hole 32 of the bezel 3. More specifically, the head part 571 of the non-conductive screw 57 is located on the upper side of the upper frame part 321, and the male screw part 572 is screwed to the second through hole 32, and protrudes to the lower side of the upper frame part 321. As a result, the male screw part 572 compresses the second conductive member 44 to separate the second conductive member 44 from the bezel 3. That is, the non-conductive screw 57 cuts the electrical connection between the bezel 3 and the second conductive member 44 by keeping both parts in a non-contact state. Thus, the second conductive member 44 is insulated from the bezel 3.

The second conductive member 44 separated from the bezel 3 opens the second through hole 32, such that it may not function as a closing member. Alternatively, the non-conductive screw 57 functions as the closing member which closes the second through hole 32. In this case, the non-conductive screw 57 suppresses the intrusion of a foreign matter and light leakage.

When assessing the noise of the respective display units in the first and second states, the non-conductive screw 57 is used substantially similar to the conductive screw 51 of Embodiment 1. First, the noise assessment of the display unit in the first state is performed in a state in which the second conductive member 44 and the second ground part 22 are not electrically connected with the bezel 3. Next, attaching and detaching works of the non-conductive screw 57 are performed. Then, the noise assessment of the display unit in the second state is performed in a state in which the first conductive member 43 and the first ground part 21 are not electrically connected with the bezel 3.

Thereafter, the manufacturer selects the first conductive member 43 (or the second conductive member 44) of the first and second conductive members 43 and 44, which may efficiently reduce the radiation noise. Further, by the manufacturer, the non-conductive screw 57 attached to the second through hole 32 is removed, and is again attached to the first through hole 31 (or the non-conductive screw 57 attached to the second through hole 32 is left as it is).

In Embodiment 1, the process of attaching the closing screw 52 is required. However, in the present embodiment, there is no need to separately attach the closing member.

Further, the display apparatus 1 may be configured to separately attach a closing member having a conductive property or non-conductivity. However, when separately attaching the closing member having the non-conductive property, it is necessary to pay attention so that the closing member does not cut the electrical connection between the first conductive member 43 (or the second conductive member 44) and the bezel 3.

In FIG. 5B, the first conductive member 43 and the first through hole 31 function as one conductive member and one through hole in the embodiment of the present invention. In addition, the second conductive member 44 and the second through hole 32 function as the other conductive member and the other through hole in the embodiment of the present invention.

Even when mass producing the display apparatuses 1, 1 and ... as described above, it is possible to optimize the reduction of radiation noise for each display apparatus 1, 1 or .... In this case, the display apparatuses 1, 1 and ... may be manufactured by using the common circuit boards 2, 2 and ..., and the bezels 3, 3 and .... Therefore, it is possible to reduce the number of parts.

Further, the first and second conductive members 43 and 44 in the display unit may be configured to be compressed and supported by the circuit board 2 and the upper frame part 321 of the bezel 3. In this case, the first and second conductive members 43 and 44 are pressed to the upper frame part 321 of the bezel 3 by an elastic restoring force of the first and second conductive members 43 and 44. Therefore, in the display apparatus 1, the electrical connection between the member of the first and second conductive members 43 and 44, which is not in contact with the non-conductive screw 57, and the bezel 3 is reliably performed.

Embodiment 4

Figure 6:
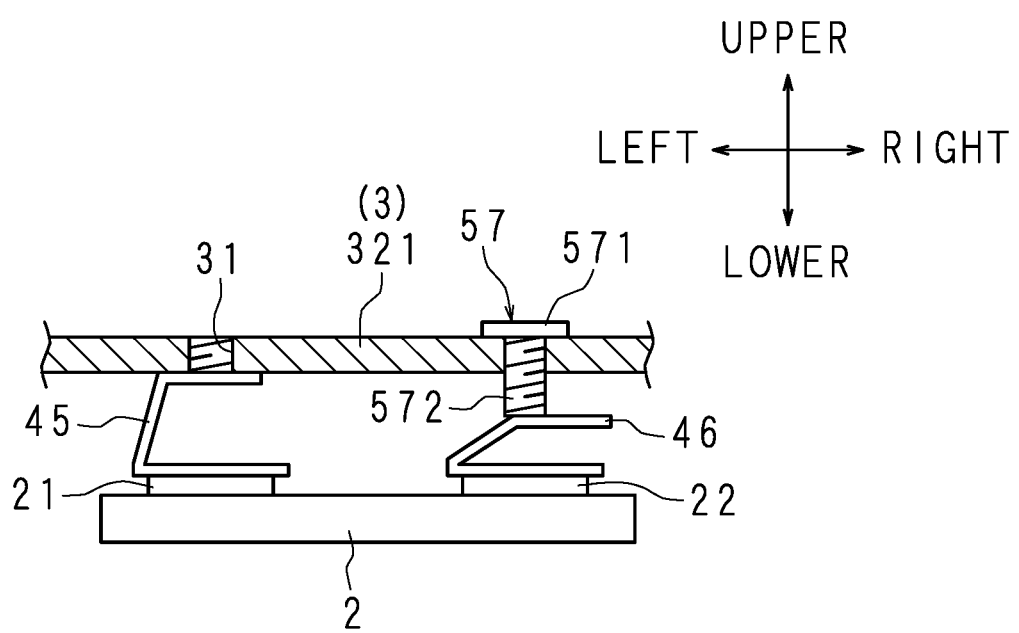
FIG. 6 is a schematic front view describing a procedure of assembling a display apparatus as an electric apparatus according to Embodiment 4 of the present invention.

FIG. 6 is a schematic front view describing a procedure of assembling the display apparatus 1 as an electric apparatus according to Embodiment 4 of the present invention. FIG. 6 corresponds to FIG. 5B.

The display apparatus 1 of the present embodiment has substantially the same configuration as the display apparatus 1 of Embodiment 3. Hereinafter, a difference from Embodiment 3 will be described, and the other portions corresponding to Embodiment 3 will be denoted by the same reference numerals, and will not be described.

In the present embodiment, instead of the first and second conductive members 43 and 44 of Embodiment 3, first and second conductive members 45 and 46 are provided.

The first and second conductive members 45 and 46 have elasticity and are non-translucent, similar to the first and second conductive members 43 and 44 of Embodiment 3. These members are compressed downwardly to be elastically deformed when an external force is applied downwardly thereto, and are restored to an original shape when the external force is removed. However, the first and second conductive members 43 and 44 are formed by using, for example, a metal leaf spring.

The first and second conductive members 45 and 46 as described above achieve the same action effects as the first and second conductive members 43 and 44, except that the shape, material thereof, and the like are different from the first and second conductive members 43 and 44 of Embodiment 3.

Embodiment 5

Figure 7A:
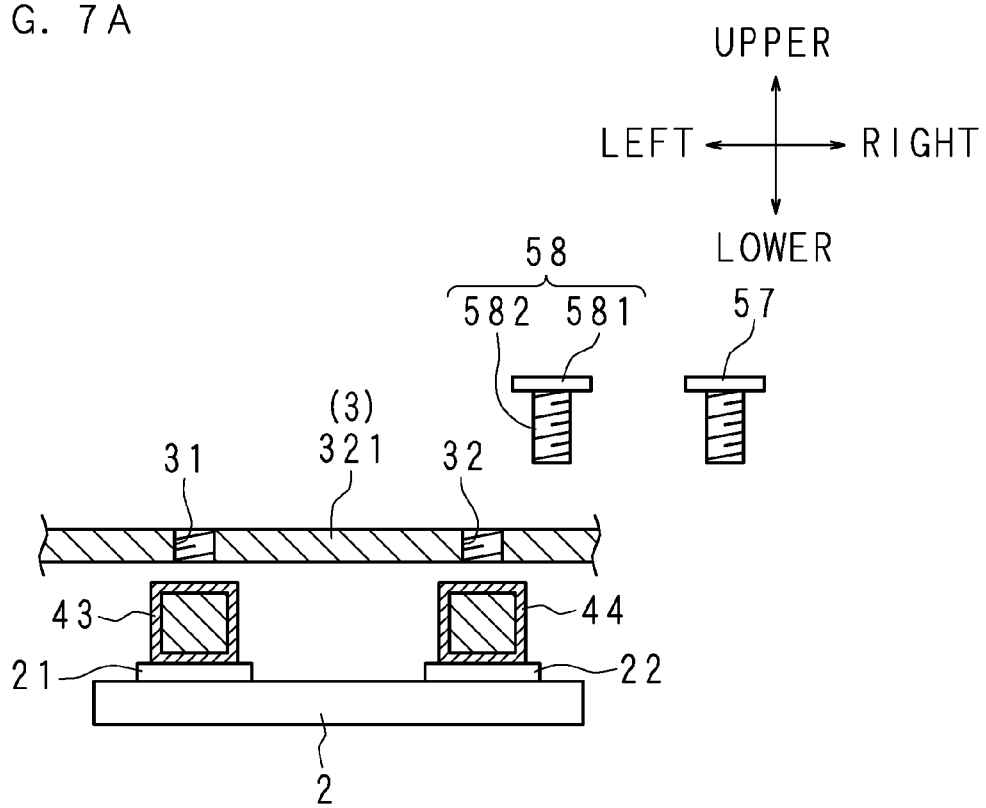
FIG. 7A is a schematic front view describing a procedure of assembling a display apparatus as an electric apparatus according to Embodiment 5 of the present invention.
Figure 7B:
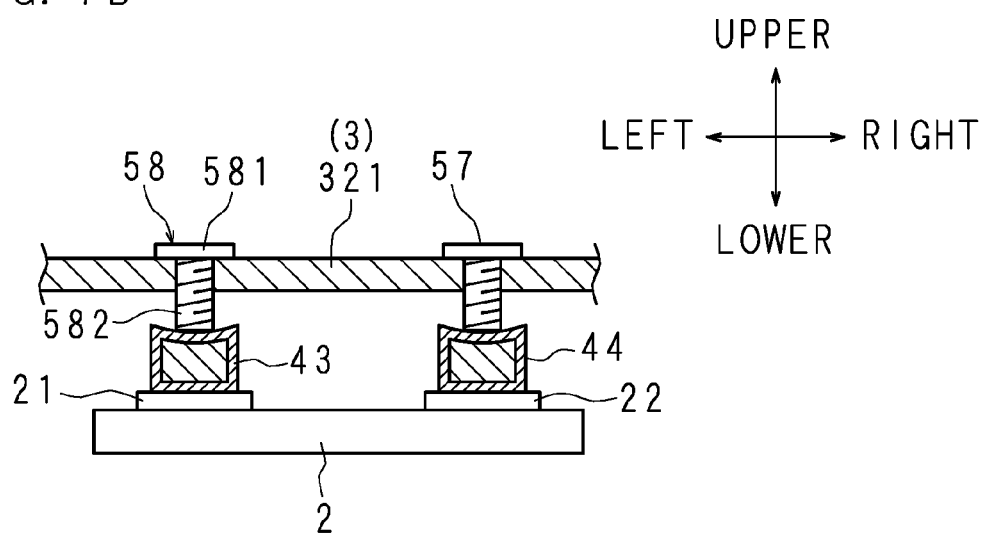
FIG. 7B is a schematic front view describing the procedure of assembling the display apparatus.

FIGS. 7A and 7B are schematic front views describing a procedure of assembling the display apparatus 1 as an electric apparatus according to Embodiment 5 of the present invention. FIGS. 7A and 7B correspond to FIGS. 5A and 5B.

The display apparatus 1 of the present embodiment has substantially the same configuration as the display apparatus 1 of Embodiment 3. Hereinafter, a difference from Embodiment 3 will be described, and the other portions corresponding to Embodiment 3 will be denoted by the same reference numerals, and will not be described.

In the display apparatus 1 of Embodiment 3, a case in which, due to a dimensional error or position shift of the respective parts of the display apparatus 1, a design change of the display apparatus 1, or the like, even if the non-conductive screw 57 is not attached, a void between at least one of the first and second conductive members 43 and 44 and the upper frame part 321 of the bezel 3 is present (see FIG. 7A), may conceived. In such the case, a conductive screw (separating member having a conductive property) 58 may be newly added.

The conductive screw 58 has the same configuration as the non-conductive screw 57, except for having a conductive property. That is, the conductive screw 58 is formed by using, for example, metal, and has a head part 581 and a male screw part 582, which are integrally formed therewith. The conductive screw 58 is non-translucent.

In FIG. 7B, the non-conductive screw 57 is inserted into the second through hole 32 of bezel 3, and the conductive screw 58 is inserted into the first through hole 31.

In this case, the first and second conductive members 43 and 44 are compressed and deformed by the male screw parts 582 and 572 to be further separated from the bezel 3. At this time, the electrical connection between the second conductive member 44 and the bezel 3 is reliably cut, but the first conductive member 43 and the bezel 3 are reliably electrically connected by the conductive screw 58. The reason is that, by the elastic restoring force of the first conductive member 43, the first conductive member 43 is pressed against the conductive screw 58.

The conductive screw 58 and the non-conductive screw 57 also function as a closing member which suppresses intrusion of a foreign matter and light leakage through the first and second through holes 31 and 32.

When assessing the noise of the respective display units in the first and second states, first, the noise assessment of the display unit in the first state is performed in a state in which the bezel 3 and the first ground part 21 are electrically connected through the first conductive member 43, and the bezel 3 and the second conductive member 44 and second ground part 22 are not electrically connected. Next, attaching and detaching works of the non-conductive screw 57 and the conductive screw 58 are performed. Then, the noise assessment of the display unit in the second state is performed in a state in which the bezel 3 and the second ground part 22 are electrically connected through the second conductive member 44, and the bezel 3 and the first conductive member 43 and first ground part 21 are not electrically connected.

Thereafter, the manufacturer selects the first conductive member 43 (or the second conductive member 44) of the first and second conductive members 43 and 44, which may efficiently reduce the radiation noise. Then, by the manufacturer, the conductive screw 58 and the non-conductive screw 57 attached to the first and second through holes 31 and 32 are replaced (or the conductive screw 58 and the non-conductive screw 57 attached to the first and second through holes 31 and 32 are left as they are).

In the present embodiment, there is no need to separately attach the closing member.

Even when mass producing the display apparatuses 1, 1 and ... as described above, it is possible to optimize the reduction of radiation noise for each display apparatus 1, 1 or .... In this case, the display apparatuses 1, 1 and ... may be manufactured by using the common circuit boards 2, 2 and ..., and the bezels 3, 3 and .... Therefore, it is possible to reduce the number of parts.

The electric apparatus according to the embodiments of the present invention has a configuration in which, in order to miniaturize and thin the apparatus, the support member is simultaneously provided with the function of shielding the radiation noise and the function of supporting the electric equipment. According to the above-described configuration, functions, purposes of use of the electric apparatus, or the like are not limited.

As this description may be embodied in several forms without departing from the spirit of essential characteristics thereof, the present embodiment is therefore illustrative and not restrictive, since the scope is defined by the appended claims rather than by the description preceding them, and all changes that fall within metes and bounds of the claims, or equivalence of such metes and bounds thereof are therefore intended to be embraced by the claims.

In addition, as long as having the effects of the present invention, components which are not disclosed in Embodiments 1 to 5 may be included in the display apparatus 1.

Components (technical characteristics) disclosed in each embodiment may be combined with each other, and by combining these components, new technical characteristics may be formed.

It is noted that, as used herein and in the appended claims, the singular forms "a", "an", and "the" include plural referents unless the context clearly dictates otherwise.

It is to be noted that the disclosed embodiment is illustrative and not restrictive in all aspects. The scope of the present invention is defined by the appended claims rather than by the description preceding them, and all changes that fall within metes and bounds of the claims, or equivalence of such metes and bounds thereof are therefore intended to be embraced by the claims.

The invention claimed is:

1. An electric apparatus which comprises: an electric equipment; a circuit board which is provided with a plurality of ground parts and is configured to make the electric equipment operate; and a support member having a conductive property which covers the circuit board in a non-contact way and supports the electric equipment, the electric apparatus comprising:
   one conductive member which is electrically connected to one ground part among the plurality of ground parts and the support member; and
   another conductive member which is electrically connected to another ground part among the plurality of ground parts and is insulated electrically from the support member, wherein
   the one and the other conductive members are respectively in non-contact with the support member,
   the support member is provided with one and another through holes corresponding to the respective one and the other conductive members, and
   the electric apparatus further comprises a contact member having the conductive property which is inserted into the one through hole and is in contact with the support member and the one conductive member.

2. The electric apparatus according to claim 1, further comprising:
   a closing member which closes the other through hole.

3. The electric apparatus according to claim 1, wherein
   the electric apparatus further comprises one and another spacers having a non-conductive property which are interposed between the circuit board and the support member and have the one and the other conductive members disposed inside the one and another spacers, and
   the contact member penetrates the one spacer and is in contact with the one conductive member.

4. The electric apparatus according to claim 1, wherein
   the electric equipment is a display panel,
   the circuit board is configured to display an image on the display panel, and
   the support member is formed in a frame shape which encloses a peripheral edge part of the display panel.

5. An electric apparatus which comprises: an electric equipment; a circuit board which is provided with a plurality of ground parts and is configured to make the electric equipment operate; and a support member having a conductive property which covers the circuit board in a non-contact way and supports the electric equipment, the electric apparatus comprising:
   one conductive member which is electrically connected to one ground part among the plurality of ground parts and the support member; and
   another conductive member which is electrically connected to another ground part among the plurality of ground parts and is insulated electrically from the support member, wherein
   the one and the other conductive members respectively have elasticity,
   the support member is provided with one and another through holes corresponding to the respective one and the other conductive members, and
   the electric apparatus further comprises a separating member having the non-conductive property which is inserted into the other through hole and is in contact with the other conductive member to compress and deform the other conductive member in a direction of being separated from the support member.

6. The electric apparatus according to claim 5, wherein
   the one conductive member is in contact with the support member.

7. The electric apparatus according to claim 5, further comprising:
   a separating member having the conductive property which is inserted into the one through hole and is in contact with the support member and the one conductive member to compress and deform the one conductive member in the direction of being separated from the support member.

* * * * *